United States Patent
Hirose et al.

(10) Patent No.: US 7,242,247 B2
(45) Date of Patent: Jul. 10, 2007

(54) DISTORTION COMPENSATION CIRCUIT, POWER AMPLIFIER USING DISTORTION COMPENSATION CIRCUIT, AND DISTORTION COMPENSATION SIGNAL GENERATING METHOD

(75) Inventors: Nobuo Hirose, Hino (JP); Nobuo Murata, Musashino (JP); Yasutoshi Tada, Yokosuka (JP); Nobuo Tsukamoto, Akishima (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 22 days.

(21) Appl. No.: 11/063,998

(22) Filed: Feb. 24, 2005

(65) Prior Publication Data

US 2005/0184803 A1 Aug. 25, 2005

(30) Foreign Application Priority Data

Feb. 25, 2004 (JP) .............................. 2004-049442

(51) Int. Cl.
 *H03F 1/26* (2006.01)
(52) U.S. Cl. ........................ 330/149; 330/278; 330/107
(58) Field of Classification Search ...................... None
 See application file for complete search history.

(56) References Cited

U.S. PATENT DOCUMENTS 5,877,653 A * 3/1999 Kim et al. .................. 330/149

6,580,320 B1 * 6/2003 Kenington et al. ......... 330/149
2004/0232986 A1 * 11/2004 Hirose et al. ............... 330/149
2005/0068102 A1 * 3/2005 Hongo et al. ............... 330/149

FOREIGN PATENT DOCUMENTS

| EP | 1 089 428 A2 | 4/2001 |
| JP | 2001-168774 | 6/2001 |
| WO | 00/74232 A1 | 12/2000 |
| WO | 01/20775 A1 | 3/2001 |

OTHER PUBLICATIONS

"An Adaptive Predistortion Method for linear Power Amplifiers" by Seto, et al. vol. 24 No. 79 BCS2000-92.
"Adaptive Digital Linearity Corrector" by Takeda, et al. ITE Technical Report vol. 23, No. 41, pp. 25-28.

* cited by examiner

*Primary Examiner*—Benny Lee
*Assistant Examiner*—Alan Wong
(74) *Attorney, Agent, or Firm*—Mattingly, Stanger, Malur & Brundidge, P.C.

(57) ABSTRACT

A distortion compensating circuit for a power amplifier attains raised compensating accuracy with shorter convergence time by accurately and quickly generating a distortion compensation signal for pre-distortion. An error signal representing the difference between the input and output signals of the power amplifier is generated. From the error signal and the input signal, the coefficients of the third-order intermodulation distortion, fifth-order intermodulation distortion and seventh-order intermodulation distortion are calculated. According to these coefficients, a distortion compensating signal which is characteristically opposite in phase and gain to the intermodulation distortions is generated.

10 Claims, 7 Drawing Sheets

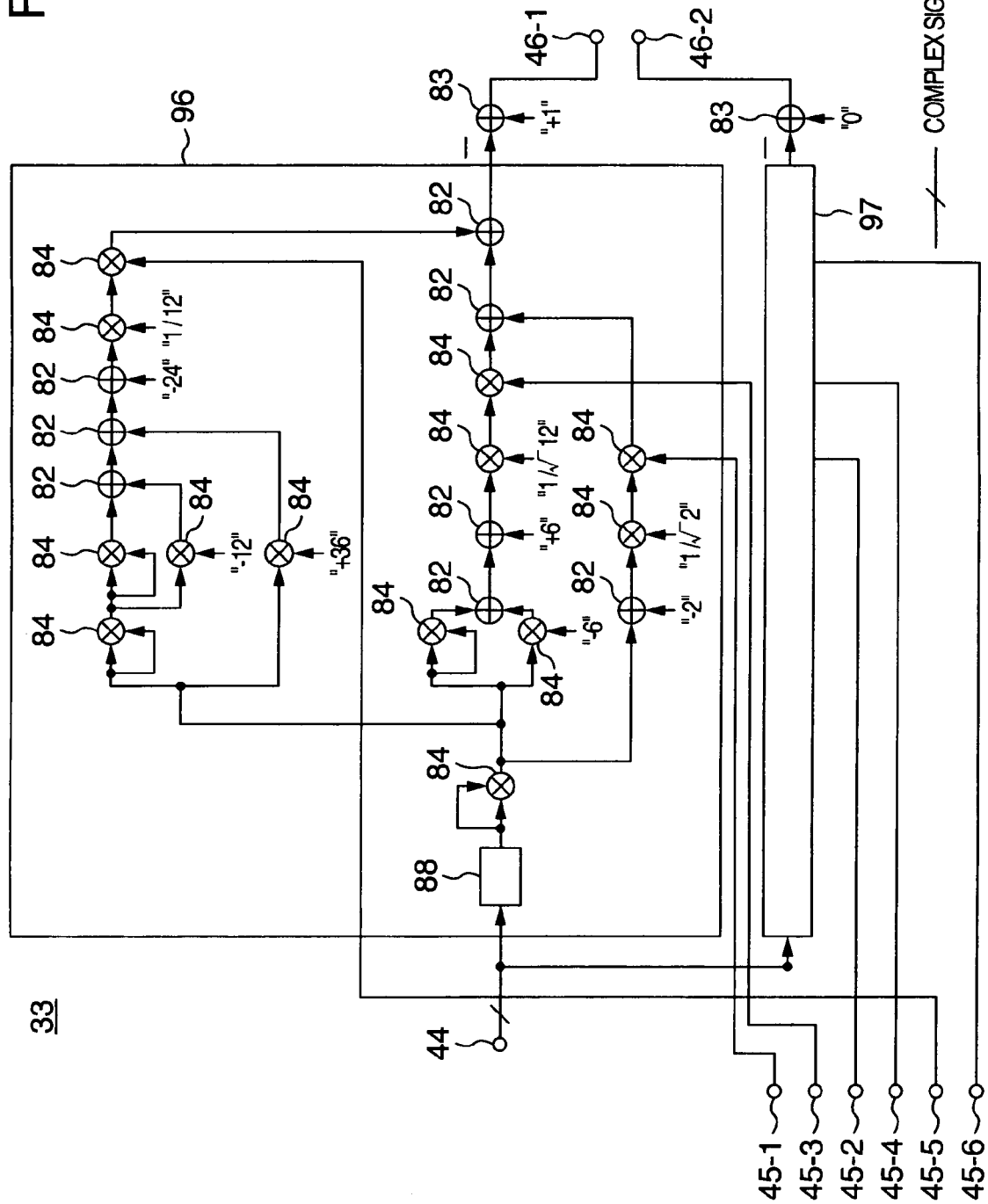

DISTORTION COMPENSATION CIRCUIT, POWER AMPLIFIER USING DISTORTION COMPENSATION CIRCUIT, AND DISTORTION COMPENSATION SIGNAL GENERATING METHOD

CROSS-REFERENCE TO RELATED APPLICATION

The present invention is related to WO 2004/045067 published on May 27, 2004 entitled "DISTORTION COMPENSATION CIRCUIT, DISTORTION COMPENSATION SIGNAL GENERATING METHOD, AND POWER AMPLIFIER", the entire content of which is incorporated herein by reference for all purposes.

INCORPORATION BY REFERENCE

The present application claims priority from Japanese application JP 2004-049442 filed on Feb. 25, 2004, the content of which is hereby incorporated by reference into this application.

BACKGROUND OF THE INVENTION

The present invention relates to a non-linear distortion compensating technique for reducing non-linear distortion components output from a transmitter that transmits radio waves amplified in power by a power amplifier.

An example of a conventional non-linear distortion compensating technique, in particular, a predistorting compensation method, is described in Eijogakugiho Vol. 24, No. 79, BCS2000-92 "An Adaptive Predistortion Method for Linear Power Amplifiers" (Document 1). The following describes this technique with reference to FIG. 7 showing a block diagram of a transmitter including a prior art power amplifier.

In FIG. 7, an input signal to be transmitted goes through a distributor 51, a delay element 52, a phase controller 53 and a gain controller 54 and is power-amplified by a power amplifier 55 before output as an output signal through a directional coupler 56. Meanwhile, part of the input signal is distributed by the distributor 51 to a detector 57 and then converted to a digital signal by an A/D converter 58.

Further, part of the power-amplified output signal is distributed to a mixer 59 and converted to an intermediate frequency by a synthesizer 60. Then, out-of-band distortion power introduced by the power amplifier 55 is extracted by a BPF 61 to a detector 62 and converted by an A/D converter 68 to a digital signal.

The following describes how the non-linear distortion compensating operation is controlled. The operations of the phase controller 53 and gain controller 54 are controlled according to signals obtained by respectively converting contents recorded in tables 66 and 67 to analog signals. The distortion that is equal in amplitude but opposite in phase to the distortion introduced by the power amplifier 55 is generated by the phase controller 53 and gain controller 54 so that non-linear compensation is performed by compensating for the distortion introduced by the power amplifier 55.

In the tables 64 and 65, envelope signals detected by the detector 57 and brought in by the A/D converter 58 are given addresses. In addition, learning is performed in the computing unit 63 by the perturbation method so as to make smaller the distortion power to be detected by the detector 62. Contents in the tables 64 and 65 are successively updated to optimum values according to the learning results so as to minimize the distortion.

According to a table update method described in the aforementioned Document 1, each of the table addresses incremented in steps of 1 is given a value by the perturbation method. However, this method is very impractical since the update requires considerably long time. It is more practical to apply the perturbation method to a predetermined representative points, for example, eight representative points, instead of every point.

FIG. 8 shows how the representative points are related with the table addresses. It is assumed here that there are table addresses 1 through 1024. The addresses 1 through 1024 are represented by eight points. In FIG. 8, each of the eight points is given a table value as indicated by a black circle. The eight representative addresses are given values (heights of the black circles).

By increasing (as indicated by an upward arrow in the figure) and decreasing (as indicated by an downward arrow in the figure) a value while checking the distortion power, the value is updated to a value which decreased the distortion. This operation is repeated for the other representative points to optimize the table values. The values given to the remaining addresses other than the eight representative addresses are updated to those determined by means of interpolation using FIR filters.

This update control is performed by applying the perturbation method to the values given to eight representative points per table or a total of sixteen points while checking the distortion power so as to optimize the tables.

Another conventional technique is also described in Japanese Patent Laid-open No. 2001-168774 (Document 2). In this method, digital base band signals are extracted from the RF input and RF output of a RF amplifier to detect and eliminate the time and phase differences between the two signals.

In order to compensate for distortion components, the amount of amplitude compensation and the amount of phase compensation are selected for the detected amplitude and phase errors between the two signals from an initially registered and adaptively updated table of compensation amounts associated with amplitude values and added successively to the RF input digital base band signal.

SUMMARY OF THE INVENTION

In the technique described in the aforementioned Document 1, non-linear compensation made for the amplitude and phase distortion components is optimized by the perturbation method so as to minimize the distortion power while checking the distortion power. In this method, however, it is not possible to recognize the sizes of amplitude and phase distortions. In addition, it is not possible to recognize what amounts of the third, fifth and seventh-order amplitude distortion components are respectively contained in the amplitude distortion. Likewise it is not possible to recognize what amounts of the third, fifth and seventh-order phase distortion components are respectively contained in the phase distortion. Accordingly, it is clear that in this method, the accuracy of compensation is low and the compensating speed (convergence) is remarkably large.

In addition, because distortion components generated in the power amplifier depend on the variation in the characteristics of semiconductor devices constituting the power amplifier, it is desirable that the distortion components generated in the power amplifier be adjusted to be reduced according to the characteristics of the power amplifier. However, this is not described in the technique described in the aforementioned Document 1.

Because only the difference is calculated in the technique described in aforementioned Document 2, the error in the difference value cannot be ignored if the amplitude of the input signal is small and therefore distortion compensation cannot be performed.

In addition, although the frequency characteristics of the output signal should preferably be linear with respect to those of the input signal of the power amplifier, it is difficult to make them uniformly linear due to the variation in the characteristics of semiconductor devices constituting the power amplifier. However, this is not described in the technique described in the aforementioned Document 1.

It is an object of the present invention to provide a distortion compensating circuit which, for use when making distortion compensation for a power amplifier, improves the accuracy of distortion compensation and increases the speed of distortion convergence by accurately and quickly generating distortion compensating signals and which adjusts the distortion components, generated in the power amplifier, to be reduced according to the characteristics of the power amplifier.

It is another object of the present invention to provide a distortion compensating circuit that makes distortion compensation for a lower amplitude level of the input signal.

It is still another object of the present invention to provide a distortion compensating circuit that makes the frequency characteristics of the output signal linear with respect to those of the input signal of a power amplifier when making distortion compensation for the power amplifier.

According to one aspect of the present invention, a distortion compensating circuit which detects distortion components generated in a power amplifying circuit amplifying power of a high frequency input signal according to an output signal and an input signal of the power amplifying circuit; and generates a distortion compensating signal according to the detected distortion components, the distortion compensating circuit includes:

an adjustment circuit which adjusts the input signal and the output signal so as to eliminate a level error, a phase error and a delay error between the input signal and the output signal;

a coefficient calculation circuit which calculates an error signal representing the difference between the adjusted input signal and output signal, and calculates, from the calculated error signal and the input signal, at least a coefficient, specific to the power amplifying circuit, of the third-order intermodulation distortion partly constituting the distortion components and additionally a coefficient, specific to the power amplifying circuit, of the fifth-order intermodulation distortion partly constituting the distortion components and a coefficient, specific to the power amplifying circuit, of the seventh-order intermodulation distortion partly constituting the distortion components;

a first distortion compensating signal generating circuit which generates, according to the calculated coefficients, a distortion compensating signal which is characteristically opposite in phase and gain to the intermodulation distortions;

a variable delay filter which passes one of the generated distortion compensating signal and the input signal; and a first multiplier which adds the signal passing through the variable delay filter and the other one of the distortion compensating signal and the input signal and outputs the added result to the power amplifying circuit.

Preferably, the distortion compensating circuit according to the present invention further comprises:

a second distortion compensating signal generating circuit which generates a fixed distortion compensating signal for use when an amplitude of the input signal is smaller than a predetermined value; and a second multiplier provided between the first multiplier and the power amplifying circuit, wherein the second multiplier adds an output of the first multiplier and the fixed distortion compensating signal generated in the second distortion compensating signal generating circuit and outputs the result to the power amplifying circuit.

More preferably, the distortion compensating circuit according to the present invention further comprises:

a frequency characteristics adjustment circuit provided between the second multiplier and the power amplifying circuit, wherein the output of the second multiplier is output to the power amplifying circuit via the frequency characteristics adjustment circuit.

More preferably, the distortion compensating circuit according to the present invention further comprises:

a frequency characteristics adjustment circuit provided between the first multiplier and the power amplifying circuit, wherein the output of the first multiplier is output to the power amplifying circuit via the frequency characteristics adjustment circuit.

The present invention provides a distortion compensating circuit which can improve the accuracy of distortion compensation and increase the speed of distortion convergence when making distortion compensation for a power amplifier by accurately and quickly generating distortion compensating signals and which can adjust the distortion components, generated in the power amplifier, to be reduced according to the characteristics of the power amplifier. The present invention also provides a distortion compensating circuit that can make distortion compensation for a lower level of the amplitude of the input signal. The present invention also provides a distortion compensating circuit that can make the frequency characteristics of the output signal linear with respect to those of the input signal of a power amplifier when making distortion compensation for the power amplifier.

Other objects, features and advantages of the invention will become apparent from the following description of the embodiments of the invention taken in conjunction with the accompanying drawings.

BRIEF DESCRIPTION OF THE DRAWINGS

FIG. 3 is a block diagram showing an embodiment of the distortion compensating signal generating circuit in the distortion compensating circuit of FIG. 1;

DETAILED DESCRIPTION OF THE EMBODIMENTS

Figure 1:
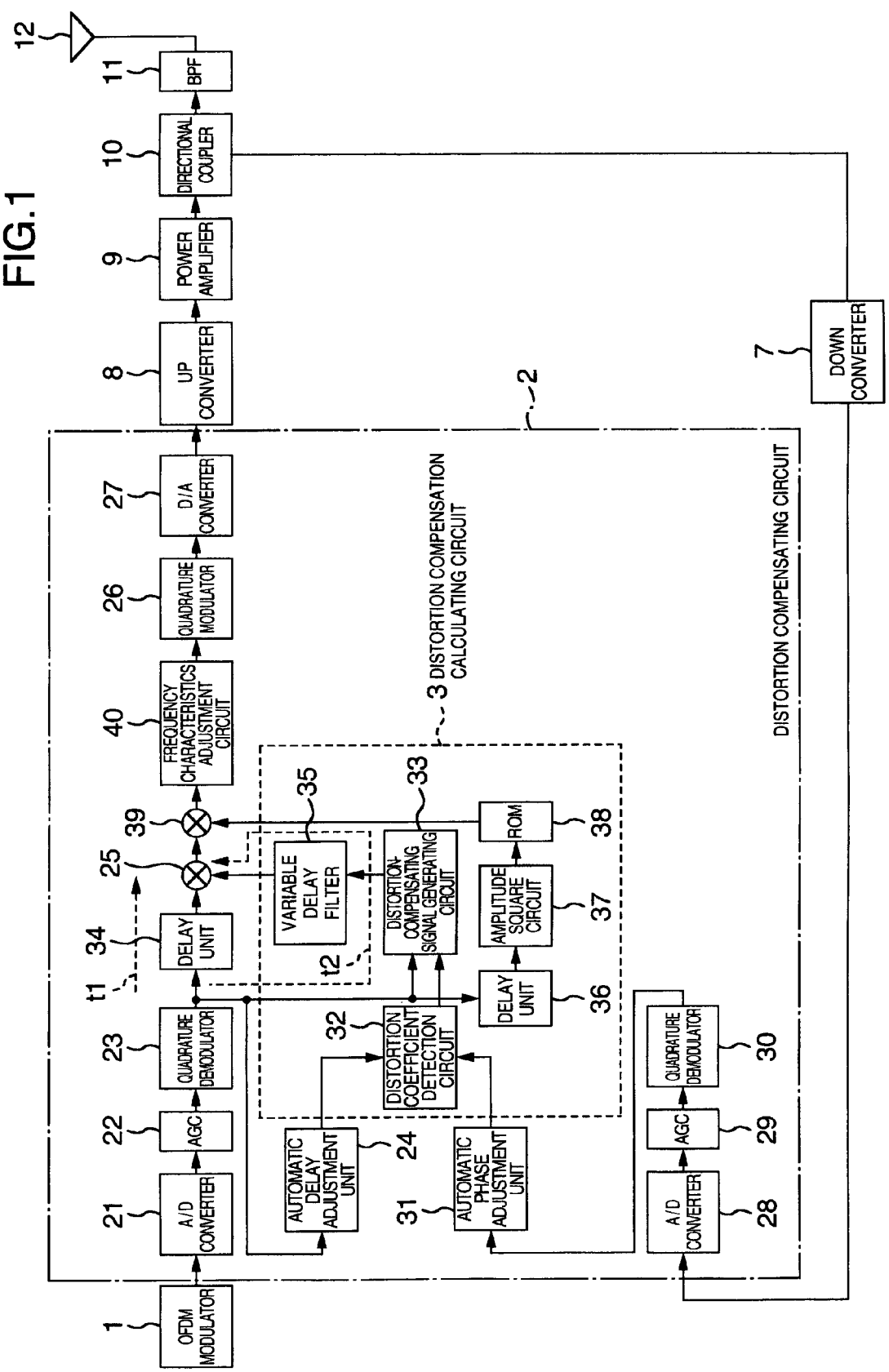
FIG. 1 is a diagram showing the block configuration of a transmitter including an embodiment of a power amplifier and a distortion compensating circuit according to the present invention.

The following describes an embodiment of the present invention.

In the embodiment of the present invention, two types of compensating signals according to respective input signal levels are generated for use as distortion compensating signals. One compensating signal is an autonomous correction-compensating signal for relatively large amplitude levels of the input signal. The other compensating signal is a fixed correction-compensating signal for relatively small levels of the input signal.

The autonomous correction-compensating signal is described below.

Firstly, a description will be made of the theory to determine the distortion introduced by a power amplifier so as to generate the distortion-compensating signal that counteracts the characteristic of the power amplifier. Generally, the power amplifying circuit is characterized by the following expanded equation (1) expressed with input signal Vin and output signal Vout:

$$Vout = \alpha 0 + \alpha 1 \cdot Vin + \alpha 2 \cdot Vin^2 + \\ \alpha 3 \cdot Vin^3 + \alpha 4 \cdot Vin^4 + \alpha 5 \cdot Vin^5 + \alpha 6 \cdot Vin^6 + \alpha 7 \cdot Vin^7 \quad (1)$$

Where, each of $\alpha 0$ to $\alpha 7$ is a coefficient for the corresponding order term and depends on the power amplifying circuit. Note that these coefficients may change due to aging and the like.

If a distortion-free signal is power-amplified by a power amplifying circuit characterized by equation (1), its output signal Vout is distorted according to the values of $\alpha 0$ to $\alpha 7$. Of the odd-order terms, the third-order, fifth-order and seventh-order terms generates the third-order intermodulation distortion (IM3), fifth-order intermodulation distortion (IM5) and seventh-order intermodulation distortion (IM7). Distortions generated according to the odd-order terms must be removed by a distortion compensating method such as pre-distorting compensation since they fall in a desired band or a band only for the input signal. However, the higher order terms beyond the seventh order term are not objects of removal since they are negligibly small in this embodiment.

Meanwhile, distortions generated according to the even-order terms are not objects of distortion compensation by the present invention since they fall into frequency components far from the desired band and therefore can be removed easily by filters or the like.

Accordingly, in the description of the distortion compensating technique of this embodiment, only the odd-order terms, especially the third, fifth and seventh-order terms, are considered.

Firstly, assume that an OFDM modulated wave is used as the input signal entered into the power amplifying circuit. The input OFDM modulated signal Vin is expressed as a function of amplitude and phase by equation (2):

$$Vin(t) = A(t) \cdot \exp(i \cdot \theta(t)) \quad (2)$$

Where, $A(t)$: Instantaneous amplitude value
$\theta$: Instantaneous phase value.

Meanwhile, the probability density function $P_A(A(t))$ of the instantaneous amplitude $A(t)$ is known to have a Rayleigh distribution as expressed by equation (3):

$$P_A(A(t)) = \frac{2A(t)}{\sigma^2} \cdot \exp\left(\frac{-A(t)^2}{\sigma^2}\right) \quad (3)$$

Where, $\sigma$ is the variance of the signal.

The probability density function $P_\theta(\theta(t))$ also has a uniform distribution as expressed by equation (4) below:

$$P_\theta(\theta(t)) = 1/2\pi; -\pi < \theta \leq \pi \quad (4)$$

If the signal's variance $\sigma = 1$ is assumed for simplification, equation (5) below is obtained from equation (3).

$$P_A(A(t)) = 2A(t) \cdot \exp(-A(t)^2) \quad (5)$$

From equation (5), the mean value of $A(t)$ for $\sigma = 1$ is calculated as expressed by equation (6) below:

$$\overline{A} = \int_{-\infty}^{+\infty} A(t) \cdot P_A(A(t)) \cdot dA = \frac{\sqrt{\pi}}{2} \quad (6)$$

Similarly, the mean value of $A^n$ is calculated according to equation (7) below:

$$\overline{A^n} = \int_{-\infty}^{+\infty} A^n(t) \cdot P_A(A(t)) \cdot dA \quad (7)$$

The results are shown in Table 1 below:

TABLE 1

| n | Mean values of $A^n$ |
|---|---|
| 1 | $\sqrt{\pi}/2$ |
| 2 | 1 |
| 3 | $3\sqrt{\pi}/4$ |
| 4 | 2 |
| 5 | $15\sqrt{\pi}/8$ |
| 6 | 6 |
| 7 | $105\sqrt{\pi}/16$ |
| 8 | 24 |
| 9 | $945\sqrt{\pi}/34$ |
| 10 | 120 |

As described earlier, IM3, IM5 and IM7 are generated by the third, fifth and seventh-order terms in equation (1). However, these terms include components pertaining to the input signal and other order components. The third-order intermodulation distortion component is calculated by subtracting the component pertaining to the input signal from the third term. The fifth-order intermodulation distortion component is calculated by subtracting from the fifth term the component pertaining to the input signal and the component pertinent to the third order term. The seventh-order modulation distortion component is calculated by subtracting from the seventh term the component pertaining to the input signal, the component pertaining to the third order term and the component pertaining to the fifth order term.

To determine the magnitude of the component pertaining to the input signal and included in the third-order term in equation (1), the cross-correlation coefficient η31 of the OFDM modulated wave is first calculated as equation (8) below:

$$\eta 31 = \overline{A^3(t) \cdot \exp(i\theta t(t)) \cdot A(t) \cdot \exp(i \cdot \theta(t))} = \overline{A^4(t)} = 2 \quad (8)$$

This equation (8) indicates that the input signal included in the third term has a magnitude of 2. Thus, the third-order intermodulation distortion is obtained by subtracting the input signal multiplied by 2 from the cube of the input signal as shown by equation (9) below:

$$\text{Third-order Intermodulation Distortion} = (A^3(t) - 2A(t)) \cdot \exp(i\theta(t)) \quad (9)$$

Then, the root mean square of equation (9) is calculated by consulting with Table 1. Since the result is "2", the variance of the third-order intermodulation distortion expressed by equation (9) is √2.

Therefore, the third-order intermodulation distortion IM3 is expressed as equation (10) below if the variance is 1:

$$IM3 = \frac{A(t) \cdot (A^2(t) - 2)}{\sqrt{2}} \cdot \exp(i\theta t(t)) \quad (10)$$

Similarly, the fifth-order intermodulation distortion IM5 is expressed as equation (11) below if the variance is 1:

$$IM5 = \frac{A(t) \cdot (A^4(t) - 6A^2(t) + 6)}{\sqrt{12}} \cdot \exp(i\theta t(t)) \quad (11)$$

Also similarly, the seventh-order intermodulation distortion IM7 is expressed as equation (12) below if the variance is 1:

$$IM7 = \frac{A(t) \cdot (A^6(t) - 12A^4(t) + 36A^2(t) - 24)}{12} \cdot \exp(i\theta t(t)) \quad (12)$$

By substituting:

$$A3(t) = \frac{A^2(t) - 2}{\sqrt{2}} \quad (13)$$

$$A5(t) = \frac{A^4(t) - 6A^2 + 6}{\sqrt{12}} \quad (14)$$

$$A7(t) = \frac{A^6(t) - 12A^4(t) + 36A^2(t) - 24}{12} \quad (15)$$

the output voltage Vout including IM3, IM5 and IM7 generated in the power amplifier can be expressed by equation (16) below:

$$Vout(t) = A(t) \cdot \exp(i \cdot \theta(t))\{1 + \alpha 3 \cdot A3(t) + \alpha 5 \cdot A5(t) + \alpha 7 \cdot A7(t)\} \quad (16)$$

The following describes how the distortion coefficients α3, α5 and α7 are calculated. Subtracting the distortion-free equation (2) from the distortion-included equation (16) results in an error signal err expressed by equation (17) below:

$$err(t) = A(t) \cdot \exp(i \cdot \theta(t))\{\alpha 3 \cdot A3(t) + \alpha 5 \cdot A5(t) + \alpha 7 \cdot A7(t)\} \quad (17)$$

Further, multiplying the error signal equation (17) by equation (2) as complex conjugates results in a product u expressed by equation (18) below:

$$u(t) = A(t)^2 \{\alpha 3 \cdot A3(t) + \alpha 5 \cdot A5(t) + \alpha 7 \cdot A7(t)\} \quad (18)$$

Further, the mean product xcor3 of u(t) of equation (18) and A3 of equation (13) results in equation (19) below:

$$xcor3(t) = \alpha 3 \cdot \overline{A(t)^2 \cdot A3(t)^2} + \alpha 5 \cdot \overline{A(t)^2 \cdot A3(t) \cdot A5(t)} + \\ \alpha 7 \cdot \overline{A(t)^2 \cdot A3(t) \cdot A7(t)} \\ = \alpha 3 \quad (19)$$

The third-order coefficient α3 can be detected by calculation in this manner.

Likewise, the mean product xcor5 of equation (18) u(t) and equation (14) results in equation (20) below:

$$xcor5(t) = \alpha 3 \cdot \overline{A(t)^2 \cdot A3(t) \cdot A5(t)} + \\ \alpha 5 \cdot \overline{A(t)^2 \cdot A5(t)^2} + \alpha 7 \cdot \overline{A(t)^2 \cdot A5(t) \cdot A7(t)} = \alpha 5 \quad (20)$$

This allows the fifth-order coefficient α5 to be detected.

Likewise, the mean product xcor7 of equation (18) u(t) and equation (15) results in equation (21) below:

$$xcor7(t) = \alpha 3 \cdot \overline{A(t)^2 \cdot A3(t) \cdot A7(t)} + \\ \alpha 5 \cdot \overline{A(t)^2 \cdot A5(t) \cdot A7(t)} + \alpha 7 \cdot \overline{A(t)^2 \cdot A7(t)^2} = \alpha 7 \quad (21)$$

This allows the seventh-order coefficient α7 to be detected.

As described so far, A3(t), A5(t), and A7(t) are calculated from the input signal Vin, the error signal that is the difference between the input signal Vin and the output signal Vout is calculated, the error correlation signal u(t) is calculated from the calculated error signal and the input signal Vi, the third-order coefficient α3, the fifth-order coefficient α5 and the seventh-order coefficient α7 are calculated from A3(t), A5(t), and A7(t) and the error correlation signal u(t) and, from them, the amplitude distortion and the phase distortion constituting the coefficients are calculated independently.

It is therefore possible to reduce the distortion of the output signal by generating a distortion compensating signal, which is opposite in characteristics, from the amplitude distortion and the phase distortion constituting the coefficients calculated independently as described above and by adding it to the input signal.

Because the distortion components generated in the power amplifier depend on the characteristics of the semiconductor devices constituting the power amplifier, the reduced distortion of the output signal is not always a desired reduced distortion. Thus, one of the generated distortion compensating signal and the input signal is passed through the variable delay filter, the result is added using the multiplier, and then the power is amplified by the power amplifier. Then, the distortion can be reduced to a desired level by adjusting the value of the variable delay filter while checking the output signal of the power amplifier.

Therefore, it is possible to provide a distortion compensating circuit which, for use when making distortion compensation for a power amplifier, improves the accuracy of distortion compensation and increases the speed of distortion convergence by accurately and quickly generating distortion compensating signals and which adjusts the distortion components, generated in the power amplifier, to be reduced according to the characteristics of the power amplifier.

Next, another fixed distortion compensating signal for a lower amplitude level of the input signal will be described. The lower amplitude level of the input signal refers to a level where the amplitude of the input signal is reduced substantially by about 10 dB from that of the average power of the input signal.

Usually, the power amplifier is of the push-pull type. The input signal is converted "unbalanced" to "balanced" by an input transformer before applied to a pair of FET gates with a phase difference of 180 degrees. The input signal is amplified there and converted "balanced" to "unbalanced" by an output transformer before output. In this case, the drain current of each FET does not flow almost at all when the gate bias voltage is small. In a continuous voltage region where the pushed or pulled FET is switched to the other FET, the drain current does not flow almost all. This region is distorted in characteristics when compared with regions where the drain current flows and changes. Usually, this distortion is called a crossover distortion.

In such a crossover distortion region, it is difficult to compensate for the distortion by using the aforementioned autonomous correction-compensating signal since the level change cannot easily be detected by the flowing drain current. However, attention is directed to the fact that the signal level does not change almost at all in a region where there is almost no signal level. It is possible to reduce the distortion of the output signal by preparing a compensating section where a characteristically opposite fixed correction compensating signal is created and stored in advance and adding the compensating signal to the input signal.

Figure 4A:
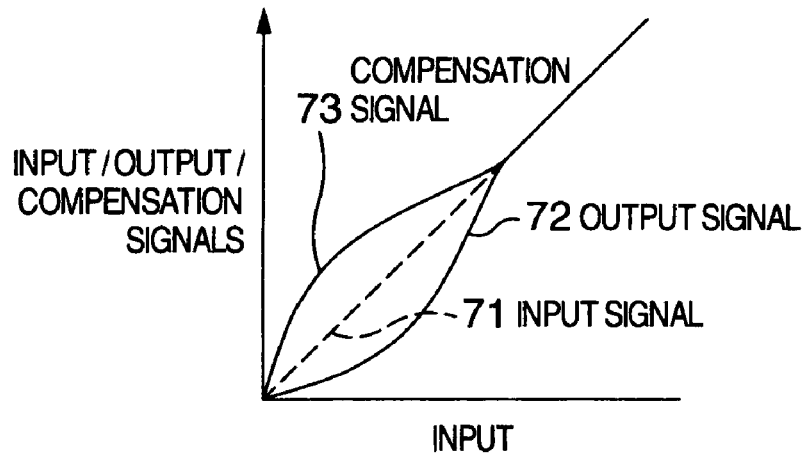
FIGS. 4A, 4B and 4C diagrams for explaining how crossover distortions are reduced.
Figure 4B:
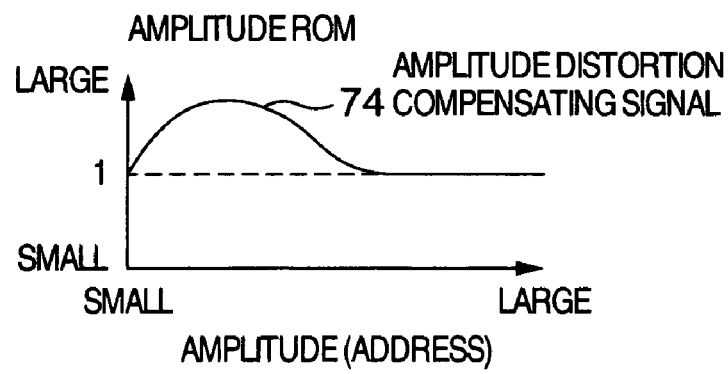
Figure 4C:
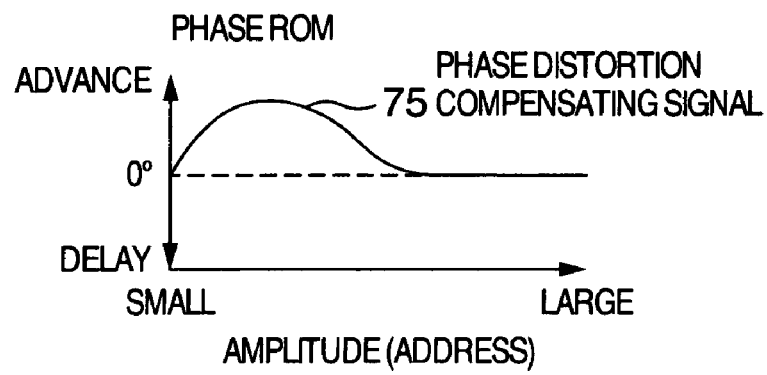

FIGS. 4A, 4B and 4C illustrate reduction of the crossover distortion. FIG. 4A is an enlarged diagram of a region where the input signal 71 has no signal level almost at all. In this region, the output signal 72 of the power amplifier 55 shows a reduction in the signal level almost down to zero. Since the signal level does not change almost at all, a fixed correction compensating signal, which is characteristically opposite to the output signal 72, is prepared in advance and added to the input signal. The fixed correction compensating signal 73 opposite characteristically to the output signal 72 may comprise an amplitude distortion compensating signal 74 as shown in FIG. 4B and a phase distortion compensating signal 75 as shown in FIG. 4C. This makes it possible to generate a distortion-reduced output signal that is almost identical to the input signal 71.

As described above, it is possible to provide a distortion compensating circuit which, for use when making distortion compensation for a power amplifier, improves the accuracy of distortion compensation and increases the speed of distortion convergence by accurately and quickly generating distortion compensating signals and which adjusts the distortion components, generated in the power amplifier, to be reduced according to the characteristics of the power amplifier and, in addition, makes distortion compensation for a small amplitude level of the input signal.

Next, although the frequency characteristics of the output signal should preferably be linear with respect to those of the input signal of the power amplifier, it is difficult to make them uniformly linear due to the variation in the characteristics of semiconductor devices constituting the power amplifier. Thus, when making distortion compensation, the signal is passed though the frequency characteristics adjustment circuit and then amplified by the power amplifier. This makes it possible to make the frequency characteristics of the power amplifier linear by making the frequency characteristics adjustment with the use of the frequency characteristics adjustment circuit while checking the output signal of the power amplifier.

The embodiment described above will be described in detail with reference to the drawings.

FIG. 1 is a block diagram showing the block configuration of a transmitter including a power amplifier and a distortion compensating circuit according to the embodiment of the present invention.

In FIG. 1, an input signal-output from an OFDM modulator 1 is entered into a distortion compensating circuit 2 of the present invention. The input signal is converted to a digital signal by an A/D converter 21. The converted signal is gain adjusted to an appropriate level by an AGC 22 and further converted to a baseband signal by a quadrature demodulator 23. The base-band signal is input to an automatic delay adjustment unit 24 and a delay unit 34. The input signal entered into the automatic delay adjustment unit 24 is given appropriate delay adjustment there and entered into a distortion coefficient detection circuit 32 of a distortion compensation calculating circuit 3.

The signal output from the delay unit 34 is entered into multipliers 25 and 39, adjusted by a frequency characteristics adjustment circuit 40, modulated by a quadrature modulator 26, converted to an analog signal by a D/A converter 27, and output from the distortion compensating circuit 2 to an UP converter 8. The signal is converted to a RF band frequency by the UP converter 8 and power-amplified to a prescribed level by a power amplifier 9. The signal is output from the power amplifier 9 as a signal including distortion components. The output signal from the power amplifier 9 is passed through a directional coupler 10 and a BPF 11 and is aired from an antenna 12.

On the other hand, the output signal, which is distributed by the directional coupler 10 and is frequency-converted to an IF band by a DOWN converter 7, is entered into the distortion compensating circuit 2. This output signal is converted to a digital signal by an A/D converter 28. The digital signal is adjusted to an appropriate level by an AGC 29 and is converted to a base-band signal by a quadrature demodulator 30.

The base-band signal is adjusted to an appropriate phase by an automatic phase adjustment unit 31 before entered into the distortion coefficient detection circuit 32 of the distortion compensating circuit 3.

The distortion coefficient detection circuit 32 receives the base-band signal, which is output from quadrature demodulator 23 and for which appropriate delay adjustment is made by the automatic delay adjustment unit 24, and the base-band signal which is output from the quadrature demodulator 30 and for which appropriate phase adjustment is made by the automatic phase adjustment unit 31. Before entered into the distortion coefficient detection circuit 32, these two base-band signals are adjusted by the automatic delay adjustment unit 24 and the automatic phase adjustment unit 31 so that they agree in delay and phase.

From the two adjusted input signals, the distortion coefficient detection circuit 32 independently calculates and detects six types of distortion: the third, fifth and seventh-order amplitude distortion and the third, fifth and seventh-order phase distortion. Based on these six types of distortion, a distortion-compensating signal generating circuit 33 generates a distortion-compensating signal. The distortion-compensating signal is entered into the multiplier 25 via a variable delay filter 35 and is added to the signal received from the quadrature demodulator 23 via the delay unit 34. This realizes accurate and quick pre-distortion compensating operation for relatively large amplitude levels of the input signal.

Figure 2:
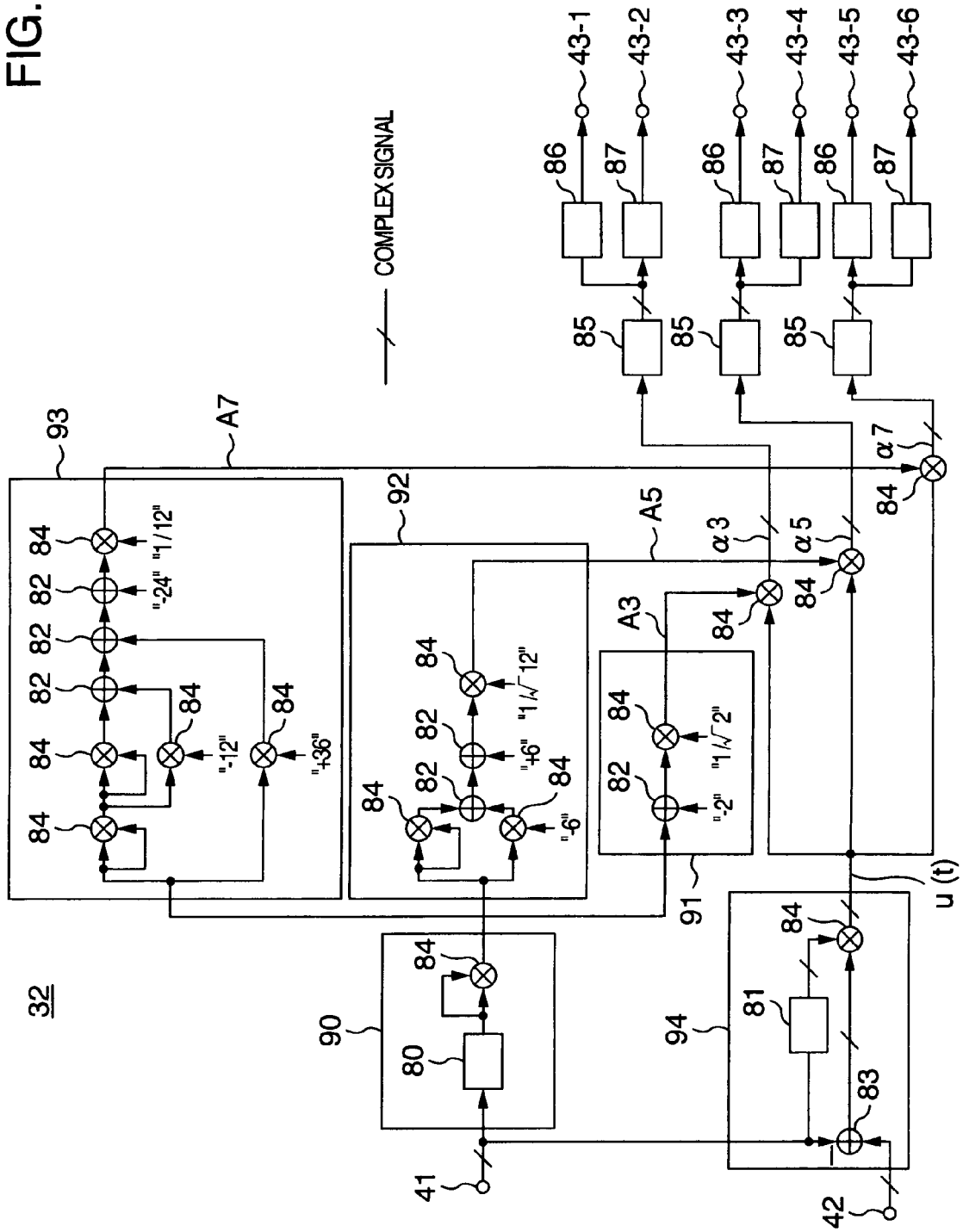
FIG. 2 is a block diagram showing an embodiment of the distortion coefficient detection circuit in the distortion compensating circuit of FIG. 1.

The following describes embodiments of the distortion coefficient detection circuit 32 and distortion compensating signal generating circuit 33 in the distortion compensating circuit 2 with reference to figures. FIG. 2 is a block diagram showing an embodiment of the distortion coefficient detection circuit 32 in the distortion compensating circuit 2 in FIG. 1. FIG. 3 is a block diagram showing an embodiment of the distortion compensating signal generating circuit 33 in the distortion compensating circuit 2 in FIG. 1. The autonomous correction compensating signal is generated through the distortion coefficient detection circuit 32 and distortion compensating signal generating circuit 33.

In FIG. 2, the output signal from the automatic delay adjustment unit 24 is entered into a terminal 41 of the distortion coefficient detection circuit 32 shown in FIG. 1 whereas the output signal from the automatic phase adjustment unit 31 is entered into a terminal 42. The input signal to the terminal 41 is entered into an absolute value circuit 80 of a circuit block (circuit blocks hereinafter denoted as blocks) 90 where the input signal is converted to a real signal representing the absolute value of the complex signal. Its real signal is entered into a multiplier 84 and squared there before output from the block 90 into a block 91, a block 92 and a block 93.

The block 91 is a circuit block to output the value of A3(t) according the aforementioned equation (13), where adder 82 adds the value −2 to $A^2(t)$ and where the multiplier 84 multiplies the added result by $1/\sqrt{2}$. Likewise, the block 92 is a circuit block to output the value of A5(t) according to the aforementioned equation (14) whereas the block 93 is a circuit block to output the value of A7(t) according to the aforementioned equation (15).

Concurrently, the input signal to the terminal 42 is entered into a block 94 together with the input signal entered into the terminal 41. The block 94 is a circuit block that calculates an error signal, which is the difference between the input signal entered into the terminal 41 and the input signal entered into the terminal 42, and, from the calculated error signal and the input signal entered into the terminal 41, calculates and outputs the value of the error correlation signal u(t) according to the aforementioned equation (18), where the input signal entered into the terminal 41 is entered into a complex conjugate circuit 81, and then entered into the multiplier 84.

The error correlation signal u(t) from this block 94 is concurrently multiplied by the signal A3(t), signal A5(t) and signal A7(t) by multipliers 84 and the results are respectively averaged by averaging circuits 85 before output as the aforementioned complex signals $\alpha 3$, $\alpha 5$ and $\alpha 7$.

Then, the signals $\alpha 3$, $\alpha 5$ and $\alpha 7$ are respectively processed by real circuits 86 and image circuits 87 into the three-order amplitude distortion coefficient signal, three-order phase distortion coefficient signal, fifth-order amplitude distortion coefficient signal, fifth-order phase distortion coefficient signal, seventh-order amplitude distortion coefficient signal and seventh-order phase distortion coefficient signal. They are output into the distortion compensating signal generating circuit 33 via terminals 43-1 to 43-6.

Into terminals 45-1 to 45-6 of the distortion compensating signal generating circuit 33 in FIG. 1, the aforementioned three-order amplitude distortion coefficient signal, three-order phase distortion coefficient signal, fifth-order amplitude distortion coefficient signal, fifth-order phase distortion coefficient signal, seventh-order amplitude distortion coefficient signal and seventh-order phase distortion coefficient signal are entered as shown in FIG. 3. In addition, the input signal from the quadrature demodulator 23 of FIG. 1 is entered into a terminal 44 is concurrently entered into a block 96 and a block 97. The input signal to the terminal 41 is also entered into an absolute value circuit 88 of circuit block 96, where the input signal is converted to a real signal representing the absolute value of the complex signal.

The internal circuit configuration of the block 97 is the same as that of the block 96.

From the input signal entered via the terminal 44, the three-order amplitude distortion coefficient signal entered via the terminal 45-1, the fifth-order amplitude distortion coefficient signal entered from the terminal 45-3 and the seventh-order amplitude distortion coefficient signal entered via the terminal 45-5, the block 96 outputs a signal of the real part value of the aforementioned err(t) equation (17). The block 97 outputs a signal of the imaginary part value of the aforementioned err(t) equation (17) from the input signal entered via the terminal 44, the third-order phase distortion coefficient signal entered from 45-2, the fifth-order phase distortion coefficient signal entered via 45-4 and the seventh-order phase distortion coefficient signal entered via 45-6.

The real part value signal of $\alpha 3A3(t)+\alpha 5A5(t)+\alpha 7A7(t)$ output from the block 96 is subtracted from a value 1 signal by an adder 83. The imaginary part value signal of $\alpha 3A3(t)+\alpha 5A5(t)+\alpha 7A7(t)$ output from the block 97 is subtracted from a value 0 signal by an adder 83. The resulting signals are respectively output to the multiplier 25 of FIG. 1 via terminals 46-1 and 46-2 and multiplied by the input signal there for correcting the input signal. This multiplier 25 may be a vector multiplier capable of performing multiplication by using the real part and imaginary part signals.

The signals obtained by respectively subtracting the imaginary and real part signals of $\alpha 3A3(t)+\alpha 5A5(t)+\alpha 7A7(t)$ are output as distortion compensating signals. Note that the real part value signal of $\alpha 3A3(t)+\alpha 5A5(t)+\alpha 7A7(t)$ is subtracted from the value 1 signal by the adder 83. The value 1 allows the subsequent multiplier 25 to hold the input signal from the quadrature demodulator while the amplitude-compensating signal is made characteristically opposite to the amplitude distortion generated by the power amplifier. In addition, the imaginary part value is subtracted from 0 to make the phase compensating signal characteristically opposite to the phase distortion generated in the power amplifier.

As described so far, means of calculation is used in the embodiment of the present invention to make distortion compensation and to increase the speed of distortion convergence without using the perturbation method. That is, from the input signal and the output signal of a power amplifier, the distortion coefficient detection circuit 32 detects the third-order, fifth-order, and seventh-order amplitude and phase distortions independently and, based on the detected third-order, fifth-order, and seventh-order amplitude and phase distortions, the distortion compensating signal generating circuit 33 generates a distortion compensating signal. This makes it possible to accurately and quickly detect distortion coefficients and to accurately and quickly generate a distortion compensating signal using those coefficients. Thus, it is possible to remarkably raise the accuracy of distortion compensation and shorten the converging time.

The distortion convergence time refers to a time required to reduce IMD (intermodulation distortion) from −33 dB to −50 dB based on the signal level 5A of a signal to be aired in FIG. 5 that will be described later.

The distortion compensating signal generated by the distortion compensating signal generating circuit 33 in FIG. 3 and FIG. 1 is sent to the multiplier 25 via the variable delay filter 35 and is added to the signal sent from the quadrature demodulator 23 via the delay unit 34. Therefore, when the time required for the signal from the quadrature demodulator 23 to be added to the multiplier 25 via the delay unit 34 is t1 and the time required for the signal from the quadrature demodulator 23 to be added to the multiplier 25 via the distortion compensating signal generating circuit 33 and the variable delay filter 35 is t2, the ratio of t2 to t1 is adjusted by adjusting the value of the variable delay filter 35. That is, while viewing the output signal of the power amplifier through a monitor not shown, the ratio can be adjusted by adjusting the value of the variable delay filter 35 so that the distortion of the output signal of the power amplifier 9 becomes a desired distortion.

Figure 5:
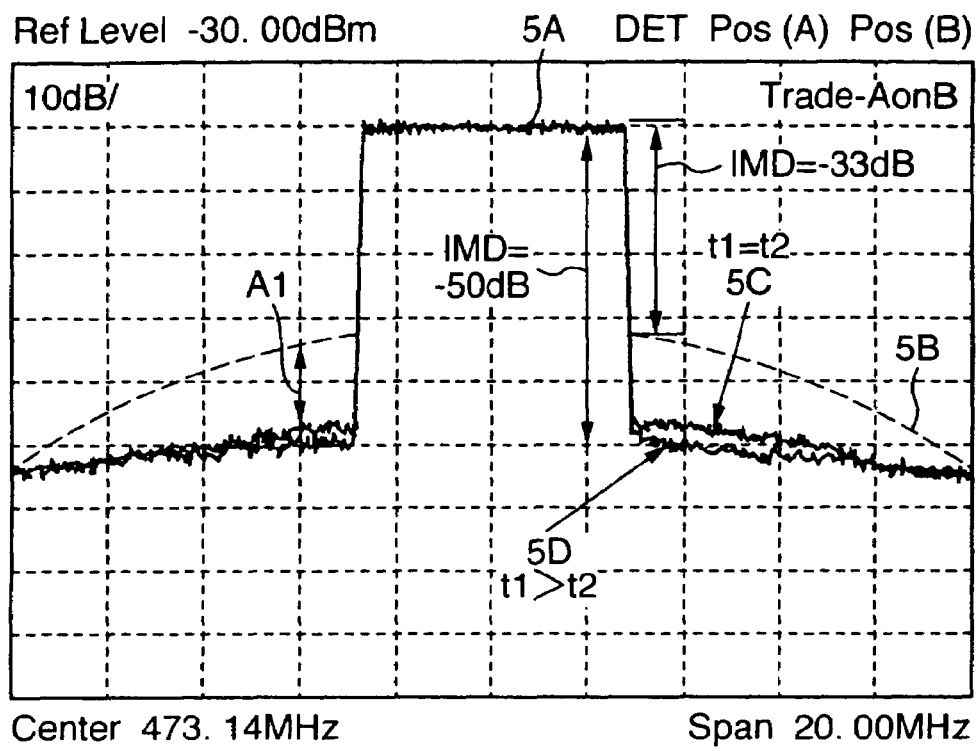
FIG. 5 is a diagram showing the spectrum of the output signal of the power amplifier of FIG. 1
Figure 8:
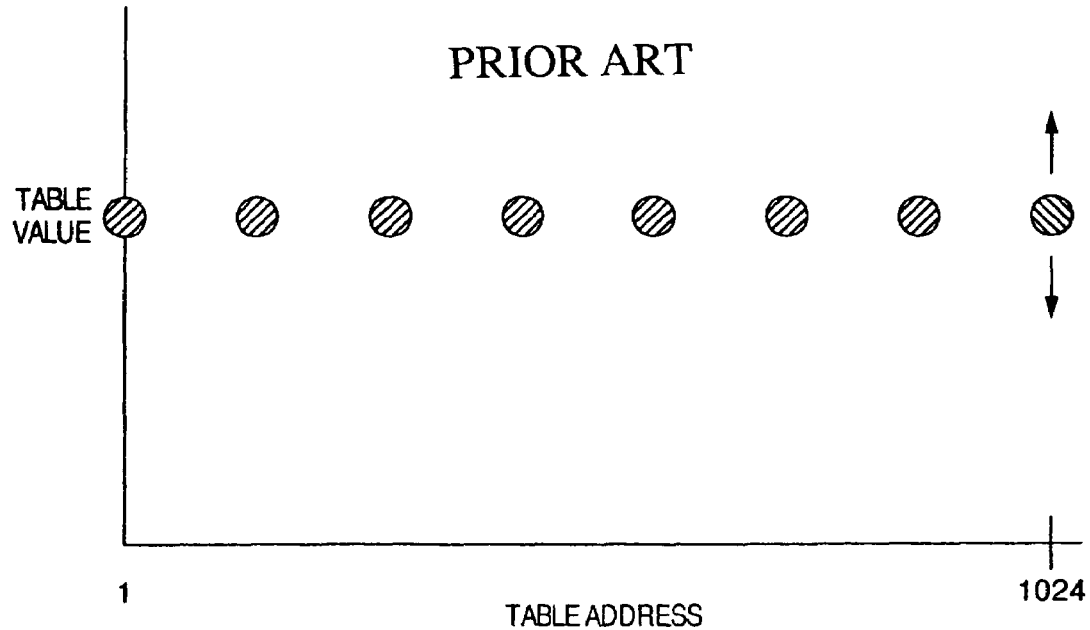
FIG. 8 is a diagram showing how representative points are related with table addresses when values are determined for the representative points by the perturbation method in FIG. 7.

FIG. 5 is a diagram showing the spectrum of the output signal of the power amplifier 9 in FIG. 1. The horizontal axis indicates the frequency, and the vertical axis indicates the amplitude level dB. The numeral 5A in the center of the figure indicates the signal to be aired and, at the frequencies on both sides of that signal, the output signal on which distortion component 5B is superimposed is output from the power amplifier 9. The distortion compensating circuit 2 of the present invention reduces the distortion component 5B to the level indicated by the distortion component 5C or 5D with the result that the S/N of the output signal to the distortion can be greatly improved.

However, because distortion components generated in the power amplifier 9 depend on the variation in the characteristics of semiconductor devices constituting the power amplifier, the distortion components generated from the distortion compensating circuit 2 of the present invention also vary as shown by 5C or 5D. Therefore, when the distortion components are those indicated, for example, by 5C, the required S/N is somewhat low.

In such a case, the value of the variable delay filter 35 can be adjusted to reduce the distortion components slightly to the level of 5D to adjust the S/N to a required value.

FIG. 5 shows an example in which, upon detecting the distortion component 5C when t1=t2, the value of the variable delay filter 35 is adjusted so that the time relation becomes t1>t2 to reduce the distortion component to 5D. Of course, depending upon the distortion components generated in the power amplifier 9, the value of the variable delay filter 35 is required to be adjusted in some cases but not in other cases. It is also possible to make adjustment on the quadrature demodulator 23 side by exchanging the variable delay filter 35 with the delay unit 34. Providing the variable delay filter 35 allows the user to finally adjust the final distortion components generated in the power amplifier 9.

As described above, distortion components can be reduced first by the distortion coefficient detection circuit 32 and the distortion compensating signal generating circuit 33.

When IMD cannot be reduced from −33 dB to −50 dB by the distortion coefficient detection circuit 32 and the distortion compensating signal generating circuit 33, the value of the variable delay filter 35 is adjusted to adjust the time t2. In addition, when IMD cannot be reduced from −33 dB to −50 dB even after the time t2 is adjusted, the frequency characteristics adjustment circuit 40 is used for adjustment.

Figure 6:
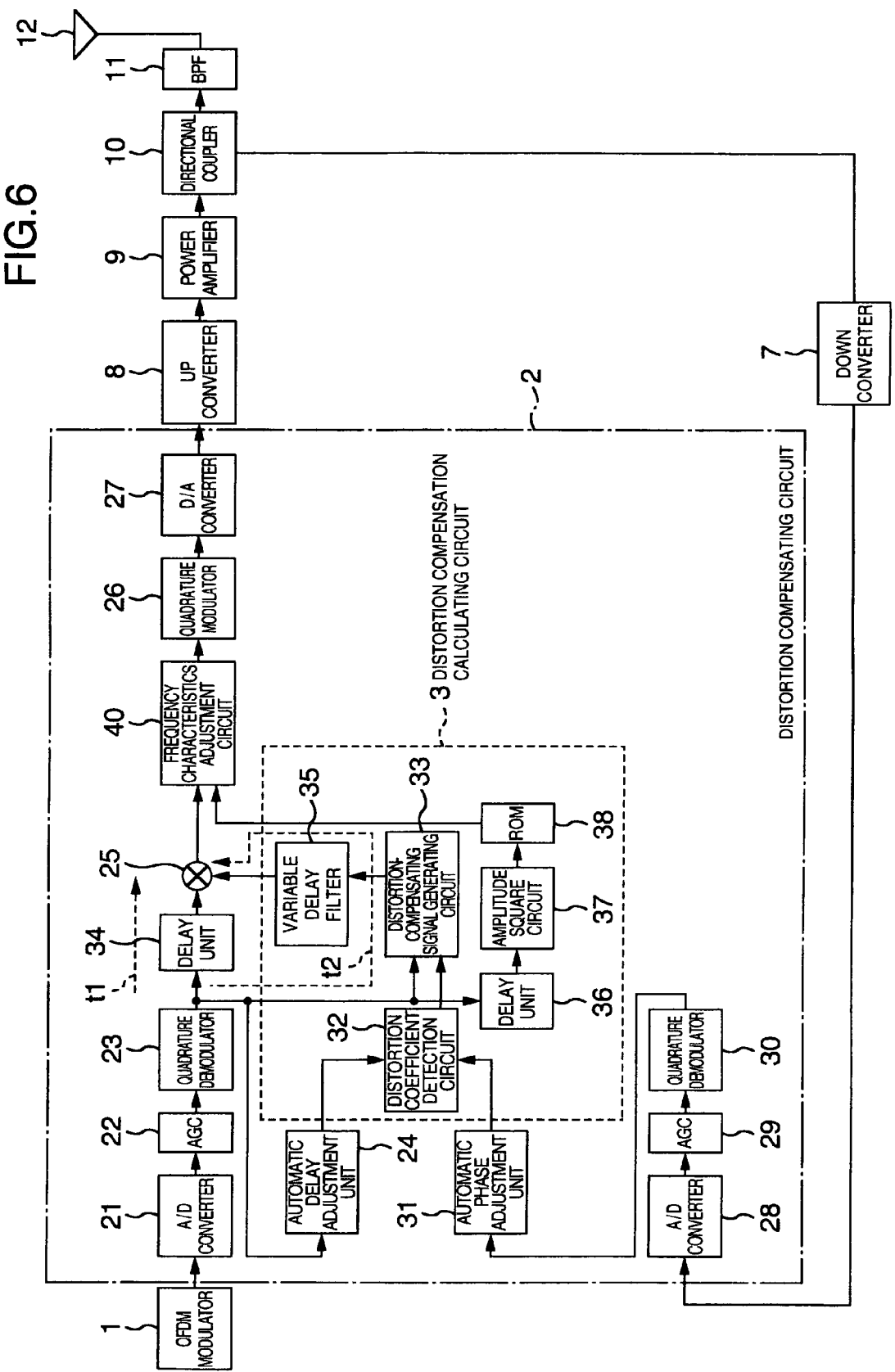
FIG. 6 is a diagram showing the block configuration of a transmitter including a variation of the power amplifier and the distortion compensating circuit according to the present invention.
Figure 7:
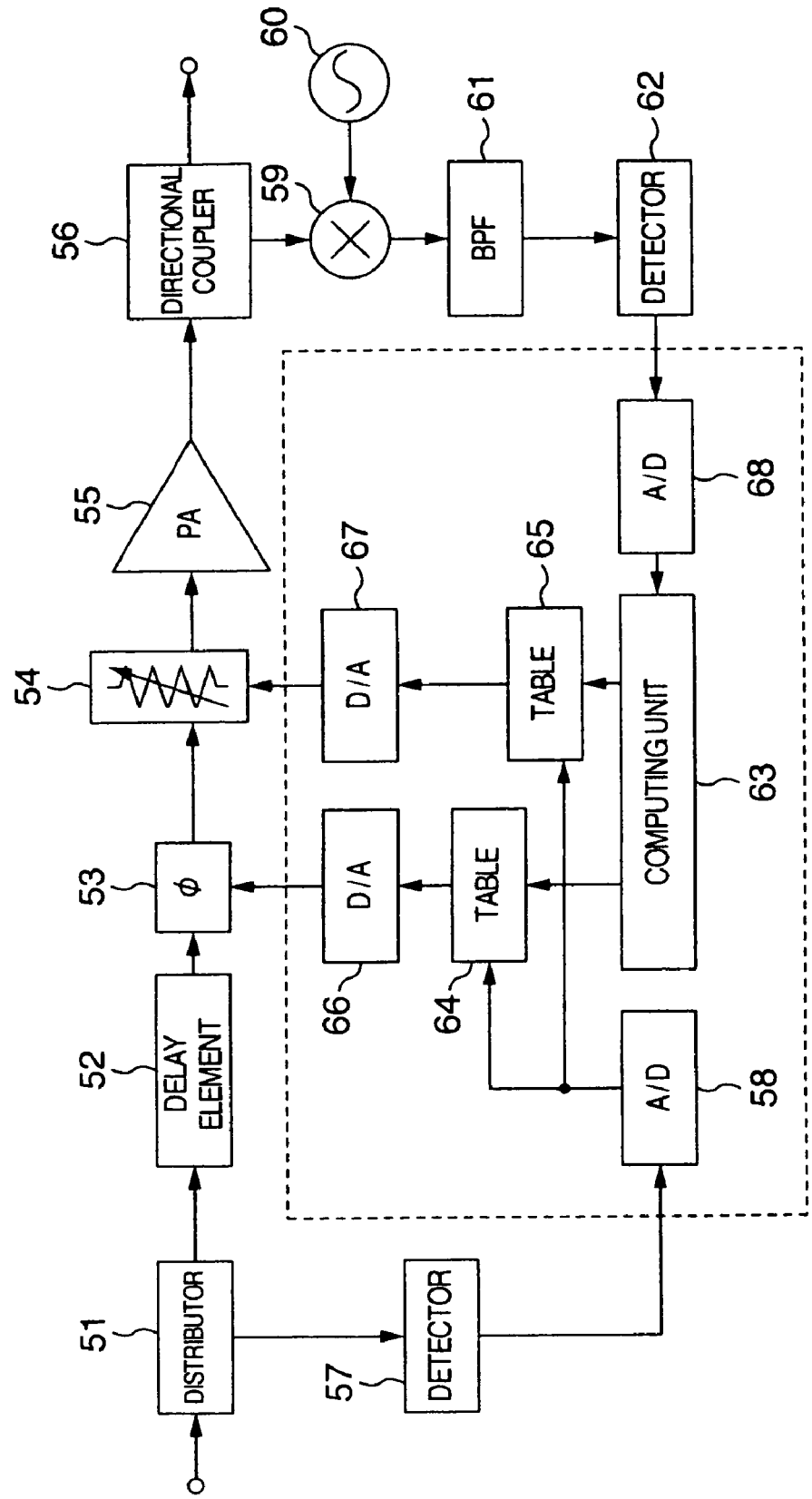
FIG. 7 is a block diagram of a prior art transmitter including a power amplifier.

Distortion components can also be removed either by the configuration in which the frequency characteristics adjustment circuit 40 is provided in the following stage of the distortion compensating means, that is, between the multiplier 25 and the quadrature demodulator 26 (multiplier 39 is removed) (see FIG. 6) or by the configuration in which it is provided between the multiplier 39 connected to the multiplier 25 and the quadrature demodulator 26.

In addition, the frequency characteristics adjustment circuit 40 can flatten the amplitude level in the signal 5A part.

The configuration of the frequency characteristics adjustment circuit 40 is known as disclosed in "Adaptive Digital Linearity Corrector", Haruo Takeda et al., ITE Technical Report Vol. 25, No.41, PP.25 to 28 (Jun. 22. 2001), for example. That is, the frequency characteristics adjustment circuit may be a linear compensation (frequency characteristics compensation) circuit which is configured to compensate the amplitude frequency characteristics and the phase frequency characteristics (group delay characteristics) by using a complex digital FIR filter.

The reduction in the distortion convergence time is achieved by the distortion coefficient detection circuit 32 and the distortion compensating signal generating circuit 33. That is, because the third, fifth and seventh-order amplitude and phase distortions detected by the distortion coefficient detection circuit 32 are independent of each other and therefore do not affect each other when the distortion compensating signal is generated by the distortion compensating signal generating circuit 33, the convergence time is reduced. In this embodiment, the distortion convergence time can be reduced to about 1/6000 of that described in Document 1. That is, about one minute of distortion convergence time described in Document 1 can be reduced to about 10 ms.

The following describes fixed correction compensating signals. The fixed correction compensating signals are prepared and stored in the fixed correction ROM 38. The fixed correction ROM 38 includes an amplitude distortion ROM for storing amplitude distortion compensating signals 74 shown in FIG. 4B and a phase distortion ROM for storing phase distortion compensating signals 75 shown in FIG. 4C. Addresses are assigned to amplitudes of the output signal from the quadrature demodulator 23.

The output signal of the quadrature demodulator 23 specifies the address of the fixed correction ROM 38 via a delay unit 36 and an amplitude square circuit 37. The content of the specified address (amplitude square circuit output) is read from the fixed correction ROM 38 and, in the multiplier 39, is added to the output signal of the multiplier 25. In this way, a crossover distortion generated when the amplitude level is low can be removed by the fixed distortion compensating signal.

By correcting the input signal with the autonomous correction compensating signal and the fixed distortion compensating signal through the multipliers 25 and 39, it is possible to accurately and quickly generate the distortion compensating signal over a wide range of amplitude level, from crossover distortions caused at low amplitude levels to distortions caused at relatively high amplitude levels. This provides a distortion compensating circuit that can increase the accuracy of distortion compensation, reduce the distortion convergence time, and adjust distortion components generated in a power amplifier to be reduced according to the characteristics of the power amplifier.

Next, the distortion-compensated input signal is input to the frequency characteristics adjustment circuit 40 and, after passing through the frequency characteristics adjustment circuit 40 that makes the frequency characteristics of the output signal linear with respect to the input signal of the power amplifier 9, the signal is input to the power amplifier 9 in the following stage for amplifying the power. In this way, even when the frequency characteristics of the output signal of the power amplifier 9 cannot be set linear with respect to the input signal in advance, the frequency characteristics of the power amplifier can be made linear by adjusting the frequency characteristics with the use of the frequency characteristics adjustment circuit while checking the output signal of the power amplifier 9.

The application of the present invention to the OFDM modulation method has been described above as an example. The present invention can also be applied to other modulation methods such as the QPSK(phase shift keying) modulation method, CDMA(code division multiple access) modulation method, 16 QAM(quadrature amplitude modulation) modulation method, and 64 QAM(quadrature amplitude modulation) modulation method.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A distortion compensating circuit which detects distortion components generated in a power amplifying circuit amplifying power of a high frequency input signal according to an output signal and an input signal of the power amplifying circuit, and generates a distortion compensating signal according to the detected distortion components, said distortion compensating circuit comprising:
   a first adjustment circuit which adjusts the input signal and the output signal to an appropriate level;
   a second adjustment circuit which adjusts the input signal and the output signal to an appropriate phase;
   a third adjustment circuit which adjusts the input signal and the output signal to an appropriate delay;
   a distortion coefficient detection circuit which calculates an error signal representing the difference between the adjusted input signal and output signal, and calculates, from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation distortion partly constituting the detected distortion components and a coefficient, specific to the power amplifying circuit, of a seventh-order intermodulation distortion partly constituting the detected distortion components;
   a first distortion compensating signal generating circuit which generates, according to the calculated coefficients, a distortion compensating signal which is characteristically opposite in phase and gain to the intermodulation distortions;
   a variable delay filter which passes either the generated distortion compensating signal or the input signal based on a location of the variable delay filter; and
   a first multiplier which multiplies the signal passing through said variable delay filter by the input signal, if the variable delay filter passes the generated distortion compensating signal, or multiplies the signal passing through said variable delay filter by the generated distortion compensating signal, if the variable delay filter passes the input signal, and outputs a signal, which is the signal passing through said variable delay filter multiplied by either the input signal or the generated distortion compensating signal, to said power amplifying circuit.

2. The distortion compensating circuit according to claim 1, further comprising:
   a second distortion compensating signal generating circuit which generates a fixed distortion compensating signal for use when an amplitude of the input signal is smaller than a predetermined value; and
   a second multiplier provided between said first multiplier and said power amplifying circuit,
   wherein said second multiplier multiplies an output of said first multiplier and the fixed distortion compensating signal generated in said second distortion compensating signal generating circuit and outputs the result to said power amplifying circuit.

3. The distortion compensating circuit according to claim 2, further comprising:
   a frequency characteristics adjustment circuit provided between said second multiplier and said power amplifying circuit,
   wherein the output of said second multiplier is output to said power amplifying circuit via said frequency characteristics adjustment circuit.

4. The distortion compensating circuit according to claim 1, further comprising:
   a frequency characteristics adjustment circuit provided between said first multiplier and said power amplifying circuit,
   wherein the output of said first multiplier is output to said power amplifying circuit via said frequency characteristics adjustment circuit.

5. A distortion compensating signal generating method for detecting distortion components generated in a power amplifying circuit amplifying power of a high frequency input signal according to the output signal and the input signal, and generating a distortion compensating signal according to the detected distortion components, said distortion compensating signal generating method comprising the steps of:
   adjusting the input signal and the output signal to an appropriate level, phase and delay;
   calculating an error signal representing the difference between the adjusted input signal and output signal,
   calculating, from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation distortion partly constituting the detected distortion components and a coefficient, specific to the power amplifying circuit, of a seventh-order intermodulation distortion partly constituting the detected distortion components are calculated;

generating, according to the calculated coefficients, a distortion compensating signal which is characteristically opposite in phase and gain to the intermodulation distortions;

passing either the generated distortion compensating signal or the input signal through a variable delay filter, based on a location of the variable delay filter; and multiplying the signal, which passed through said variable delay filter, and the input signal, if the variable delay filter passes the generated distortion compensating signal, or multiplying the signal passing through said variable delay filter and the generated distortion compensating signal, if the variable delay filter passes the input signal, and outputting a signal, which is the signal passing through said variable delay filter multiplied by either the input signal or the generated distortion compensating signal, to said power amplifying circuit.

6. A distortion compensating signal generating method according to claim 5, further comprising the steps of:

multiplying a fixed distortion compensating signal, provided for use when an amplitude of the input signal is smaller than a predetermined value, by the multiplied result and outputting the result to said power amplifier.

7. A power amplifier comprising:

a power amplifying circuit which amplifies power of a high frequency input signal; and a distortion compensating circuit which detects distortion components generated in the power amplifying circuit according to the output signal and the input signal and generates a distortion compensating signal according to the detected distortion components, wherein said distortion compensating circuit comprises:

a first adjustment circuit which adjusts the input signal and the output signal;

a second adjustment circuit which adjusts the input signal and the output signal to an appropriate phase;

a third adjustment circuit which adjusts the input signal and the output signal to an appropriate delay;

a distortion coefficient detection circuit which calculates an error signal representing the difference between the adjusted input signal and output signal, from the calculated error signal and the input signal, at least a coefficient, specific to the power amplifying circuit, of a third-order intermodulation distortion partly constituting the detected distortion components and additionally a coefficient, specific to the power amplifying circuit, of a fifth-order intermodulation distortion partly constituting the detected distortion components and a coefficient, specific to the power amplifying circuit, of a seventh-order intermodulation distortion partly constituting the detected distortion components;

a first distortion compensating signal generating circuit which generates, according to the calculated coefficients, a distortion compensating signal which is characteristically opposite in phase and gain to the intermodulation distortions;

a variable delay filter which passes either the generated distortion compensating signal or the input signal, based on a location of the variable delay filter; and a first multiplier which multiplies the signal passing through said variable delay filter and the input signal, if the variable delay filter passes the generated distortion compensating signal, or multiplies the signal passing through said variable delay filter and the generated distortion compensating signal, if the variable delay filter passes the input signal, and outputs a signal, which is the signal passing through said variable delay filter multiplied by either the input signal or the generated distortion compensating signal, to said power amplifying circuit.

8. The power amplifier according to claim 7 wherein said distortion compensating circuit further comprises:

a second distortion compensating signal generating circuit which generates a fixed distortion compensating signal for use when an amplitude of the input signal is smaller than a predetermined value; and a second multiplier provided between said first multiplier and said power amplifying circuit, wherein said second multiplier multiplies an output of said first multiplier and the fixed distortion compensating signal generated in said second distortion compensating signal generating circuit and outputs the result to said power amplifying circuit.

9. The power amplifier according to claim 8, wherein said distortion compensating circuit further comprises:

a frequency characteristics adjustment circuit provided between said second multiplier and said power amplifying circuit, wherein the output of said second multiplier is output to said power amplifying circuit via said frequency characteristics adjustment circuit.

10. The power amplifier according to claim 7, wherein said distortion compensating circuit further comprises:

a frequency characteristics adjustment circuit provided between said first multiplier and said power amplifying circuit, wherein the output of said first multiplier is output to said power amplifying circuit via said frequency characteristics adjustment circuit.

* * * * *